(12) United States Patent
Cheng et al.

(10) Patent No.: US 7,569,450 B2
(45) Date of Patent: Aug. 4, 2009

(54) SEMICONDUCTOR CAPACITORS IN HOT (HYBRID ORIENTATION TECHNOLOGY) SUBSTRATES

(75) Inventors: Kangguo Cheng, Beacon, NY (US); Ramachandra Divakaruni, Ossining, NY (US); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 11/423,284

(22) Filed: Jun. 9, 2006

(65) Prior Publication Data

US 2007/0284640 A1  Dec. 13, 2007

(51) Int. Cl.
*H01L 21/8242* (2006.01)
(52) U.S. Cl. ............... 438/243; 257/302; 257/E21.395
(58) Field of Classification Search ......... 438/241–248, 438/387, 388; 257/E21.651
See application file for complete search history.

(56) References Cited

U.S. PATENT DOCUMENTS

| 2003/0057487 A1* | 3/2003 | Yamada et al. ............... 257/347 |
| 2006/0105536 A1* | 5/2006 | Cheng et al. ................. 438/386 |

* cited by examiner

*Primary Examiner*—N Drew Richards
*Assistant Examiner*—Mamadou Diallo
(74) *Attorney, Agent, or Firm*—Schmeiser, Olsen & Watts; Steven Capella

(57) ABSTRACT

A semiconductor structure and a method for forming the same. The semiconductor structure includes a semiconductor substrate. The semiconductor structure further includes an electrically insulating region on top of the semiconductor substrate. The semiconductor structure further includes a first semiconductor region on top of and in direct physical contact with the semiconductor substrate. The semiconductor structure further includes a second semiconductor region on top of the insulating region. The semiconductor structure further includes a capacitor in the first semiconductor region and the semiconductor substrate. The semiconductor structure further includes a capacitor electrode contact in the second semiconductor region and the electrically insulating region.

13 Claims, 8 Drawing Sheets

SEMICONDUCTOR CAPACITORS IN HOT (HYBRID ORIENTATION TECHNOLOGY) SUBSTRATES

BACKGROUND OF THE INVENTION

1. Technical Field

The present invention relates to semiconductor capacitors, and more specifically, to semiconductor capacitors formed in HOT substrates.

2. Related Art

A conventional process for forming a semiconductor capacitor comprises forming two trenches in the substrate: a first trench is for the capacitor itself and a second trench is for providing an electrical contact to the capacitor. Therefore, there is a need for a method for forming the capacitor and its electrical contact in the substrate which is simpler than the method in the prior art.

SUMMARY OF THE INVENTION

The present invention provides a semiconductor structure, comprising (a) a semiconductor substrate; (b) an electrically insulating region on top of the semiconductor substrate; (c) a first semiconductor region on top of and in direct physical contact with the semiconductor substrate; (d) a second semiconductor region on top of the insulating region; (e) a capacitor in the first semiconductor region and the semiconductor substrate; and (f) a capacitor electrode contact in the second semiconductor region and the electrically insulating region.

The present invention provides a semiconductor fabrication method, comprising providing a semiconductor structure which includes (a) a semiconductor substrate, (b) an electrically insulating region on top of the semiconductor substrate, (c) a first semiconductor region on top of and in direct physical contact with the semiconductor substrate, and (d) a second semiconductor region on top of the insulating region, wherein the first semiconductor region and the second semiconductor region are electrically insulated from each other; forming a first trench, wherein the first trench is formed in the first semiconductor region and the semiconductor substrate; and forming a second trench, wherein the second trench is formed in the second semiconductor region.

The present invention provides a method for forming the capacitor and its electrical contact in the substrate, which is simpler than the method in the prior art.

DETAILED DESCRIPTION OF THE INVENTION

Figure 1:
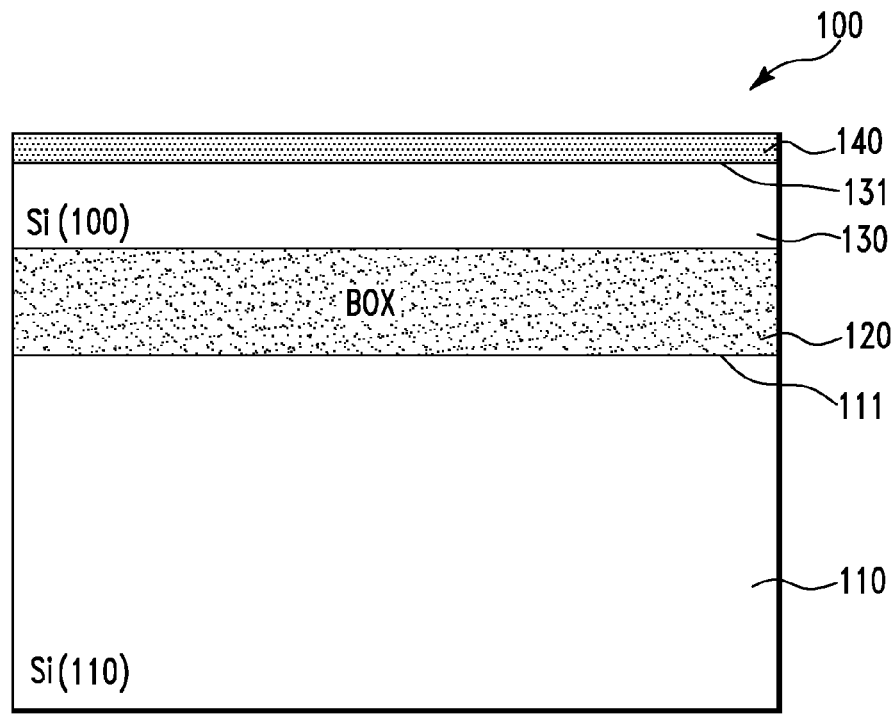
FIGS. 1-12 illustrate the fabrication of a capacitor and its electrical contact, in accordance with embodiments of the present invention.

FIGS. 1-12 show cross-section views of a semiconductor structure 100 going through different steps of a fabrication process, in accordance with embodiments of the present invention. With reference to FIG. 1, in one embodiment, more specifically, the fabrication process starts with a silicon-on-insulator (SOI) substrate 110+120+130 including (a) a first silicon layer 110, (b) a buried insulating layer 120 on top of the first silicon layer 110, and (c) a second silicon layer 130 on top of the insulating layer 120. Illustratively, the top layer of the first silicon layer 110 comprises silicon having a lattice orientation of (110), the top layer of the second silicon layer 130 comprises silicon having a lattice orientation of (100), and the buried insulating layer 120 is a BOX (Buried Oxide) layer comprising silicon oxide. Note that any other semiconductor materials such as germanium, silicon germanium, silicon carbide, gallium arsenic, gallium nitride, indium phosphoride can be used as the top semiconductor layer 110 and the bottom semiconductor layer 130. The top semiconductor layer 110 and the bottom semiconductor layer 130 can have the same or different semiconductor materials.

Next, in one embodiment, a sacrificial pad layer 140 is formed on top of the second silicon layer 130. Illustratively, the sacrificial pad layer 140 comprises silicon nitride. In one embodiment, the sacrificial pad layer 140 is formed by CVD (Chemical Vapor Deposition).

Figure 2:
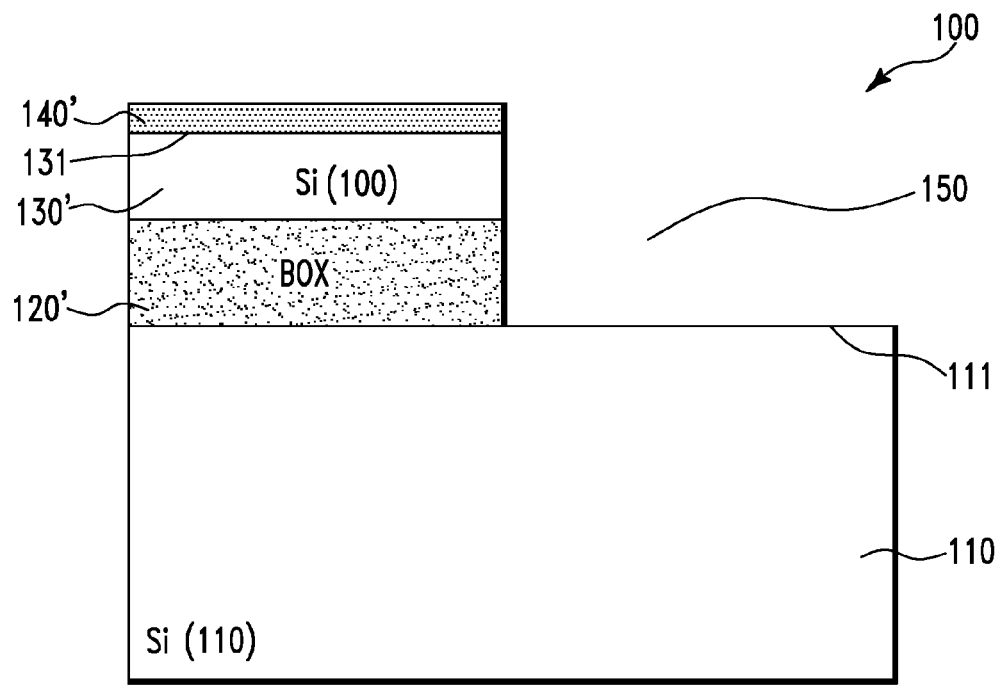

Next, in one embodiment, the sacrificial pad layer 140, the second silicon layer 130, and the BOX layer 120 are in turn patterned resulting in the semiconductor structure 100 of FIG. 2. With reference to FIG. 2, after the patterning process, what remain of the sacrificial pad layer 140, the second silicon layer 130, and the BOX layer 120 are a sacrificial pad region 140', a second silicon region 130', and a BOX region 120', respectively. Illustratively, the patterning process can involve lithography and then anisotropic etching.

Figure 3:
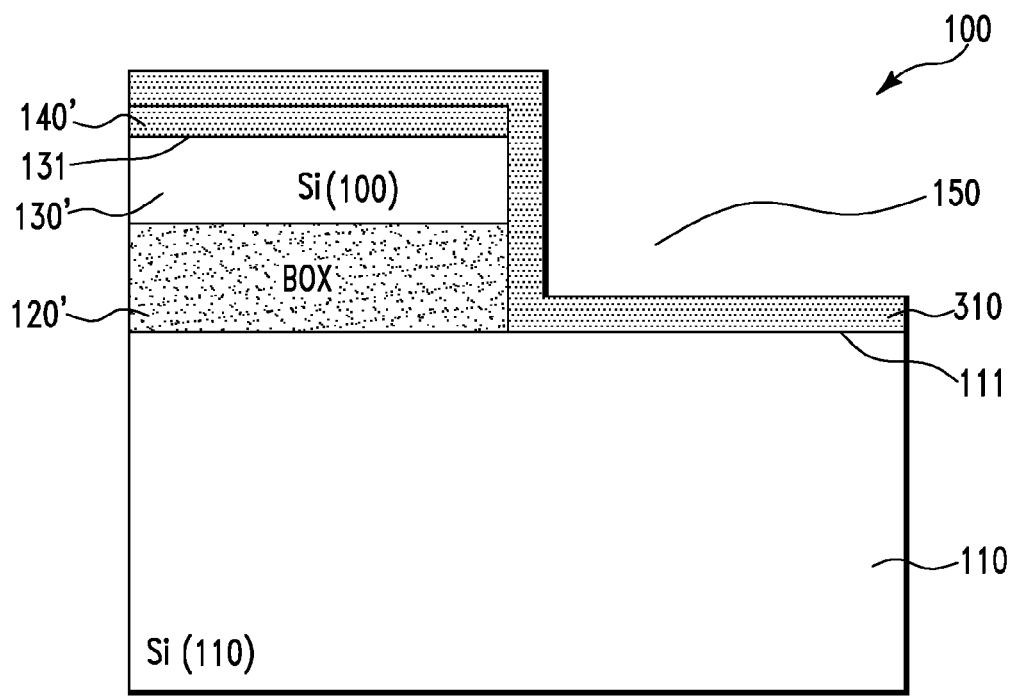

Next, with reference to FIG. 3, in one embodiment, a spacer layer 310 is formed on top of the semiconductor structure 100 of FIG. 2. Illustratively, the nitride spacer layer 310 comprises an oxide or nitride formed by (conformal) CVD. In one embodiment, the spacer layer 310 comprises silicon oxide.

Figure 4:
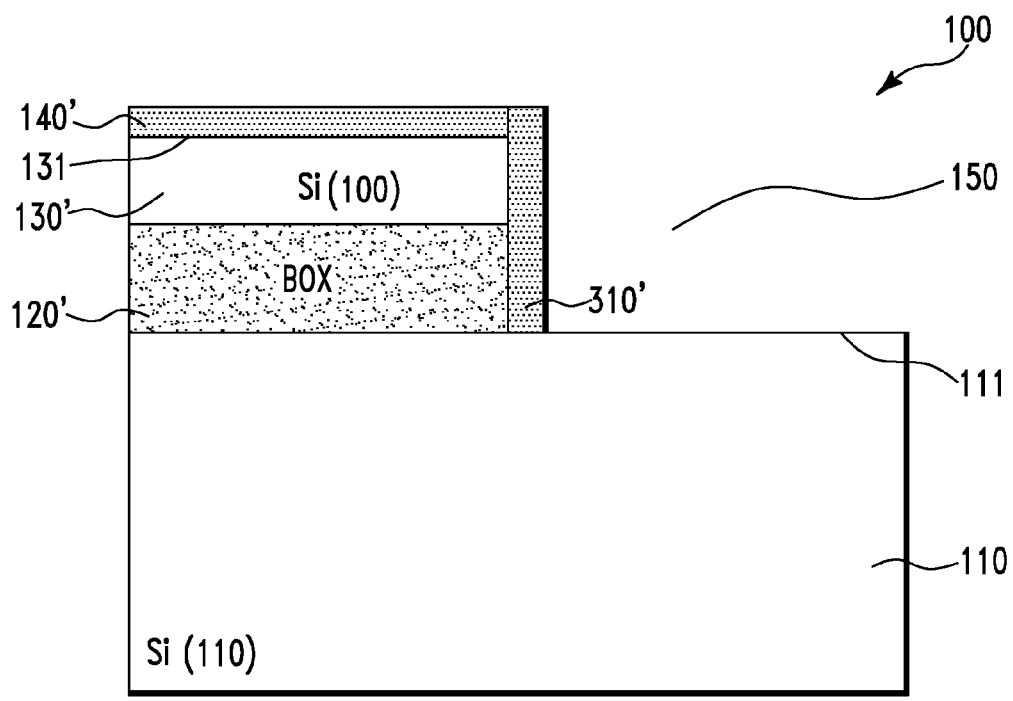

Next, in one embodiment, the nitride spacer layer 310 is anisotropically etched resulting in a nitride spacer 310' of FIG. 4. In one embodiment, the anisotropic etching of the nitride spacer layer 310 can be RIE (Reactive Ion Etching).

Figure 5:
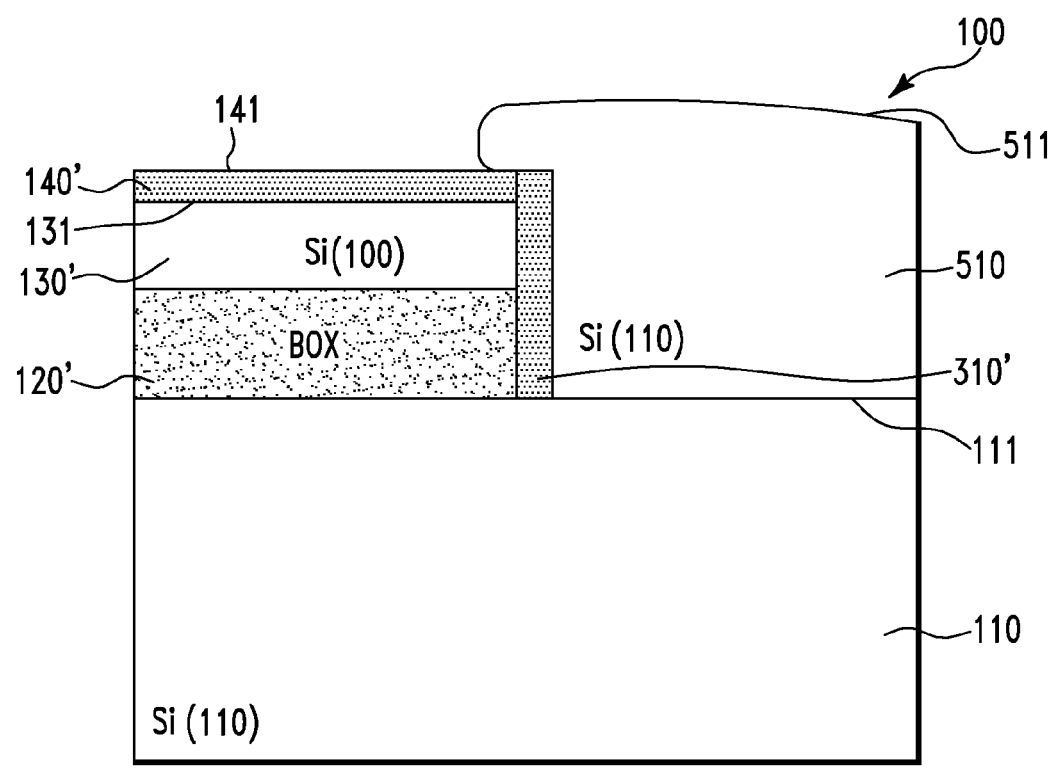

Next, with reference to FIG. 5, in one embodiment, an epi silicon region 510 is formed by the selective epitaxial growth of silicon on an exposed top surface 111 of the first silicon layer 110 using selective CVD. Because the first silicon layer 110 has the silicon lattice orientation of (110), the epi silicon region 510 also has silicon lattice orientation of (110). In one embodiment, a top surface 511 of the epi silicon region 510 is at a higher level than a top surface 141 of the sacrificial pad region 140'.

Figure 5A:
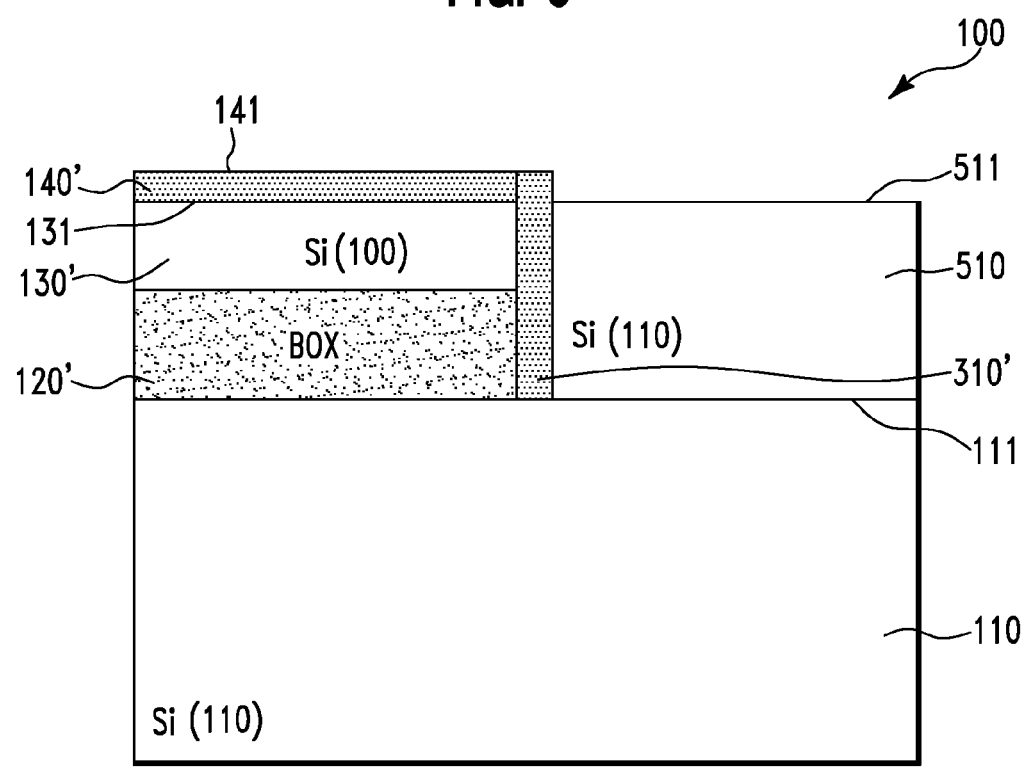

Next, in one embodiment, the epi silicon region 510 is planarized and recessed resulting in the semiconductor structure 100 of FIG. 5A. Illustratively, with reference to FIG. 5A, the planarization processes such as CMP (chemical mechanical polishing) is first performed until the top surface 511 of the epi silicon region 510 is coplanar with a top surface 141 of the sacrificial pad region 140'. The recess process such as RIE (reactive ion etching) is then performed until the top surface 511 of the epi silicon region 510 is coplanar with the top surface 131 of the second silicon region 130'.

Figure 6:
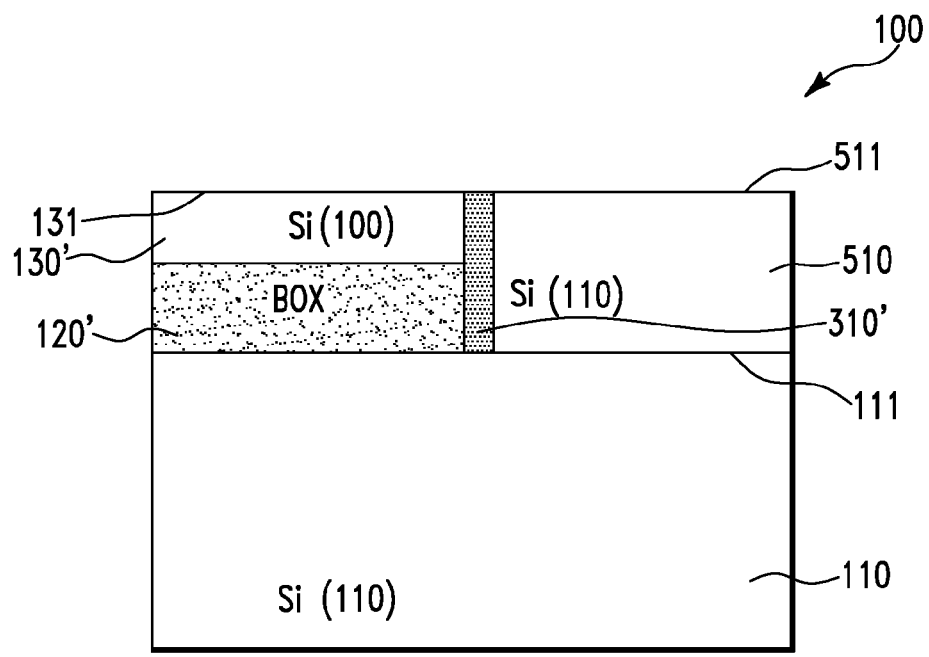

Next, in one embodiment, the entire sacrificial pad region 140' and a top portion of the spacer 310' are removed resulting in the semiconductor structure 100 of FIG. 6. Illustratively, the entire sacrificial pad region 140' and the top portion of the spacer 310' are removed by wet etching.

Figure 7:
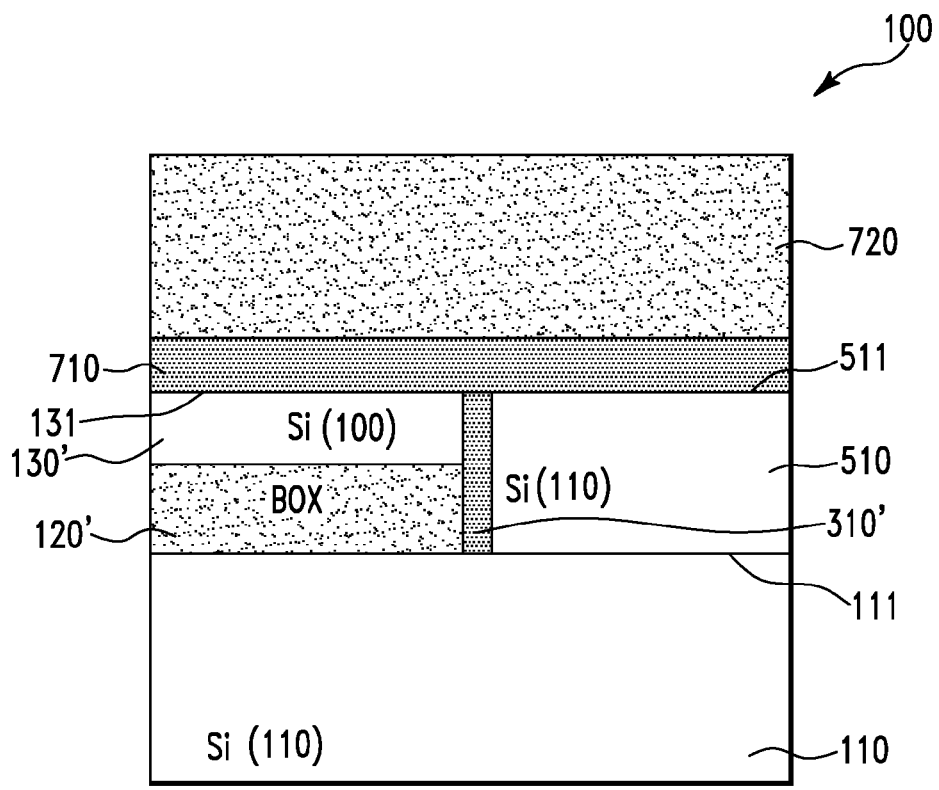

Next, with reference to FIG. 7, in one embodiment, a pad layer 710 is formed on top of the semiconductor structure 100 of FIG. 6. Illustratively, the pad layer 710 comprises silicon nitride. In one embodiment, the pad layer 710 can be formed by CVD. Optionally, an oxide layer (not shown) can be formed on top of the semiconductor structure 100 of FIG. 6 before the pad layer 710 is formed.

Next, in one embodiment, a hardmask layer 720 is formed on top of the pad layer 710. Illustratively, the hardmask layer 720 comprises BSG (Boro-Silicate Glass). In one embodiment, the hardmask layer 720 can be formed by CVD.

Figure 8:
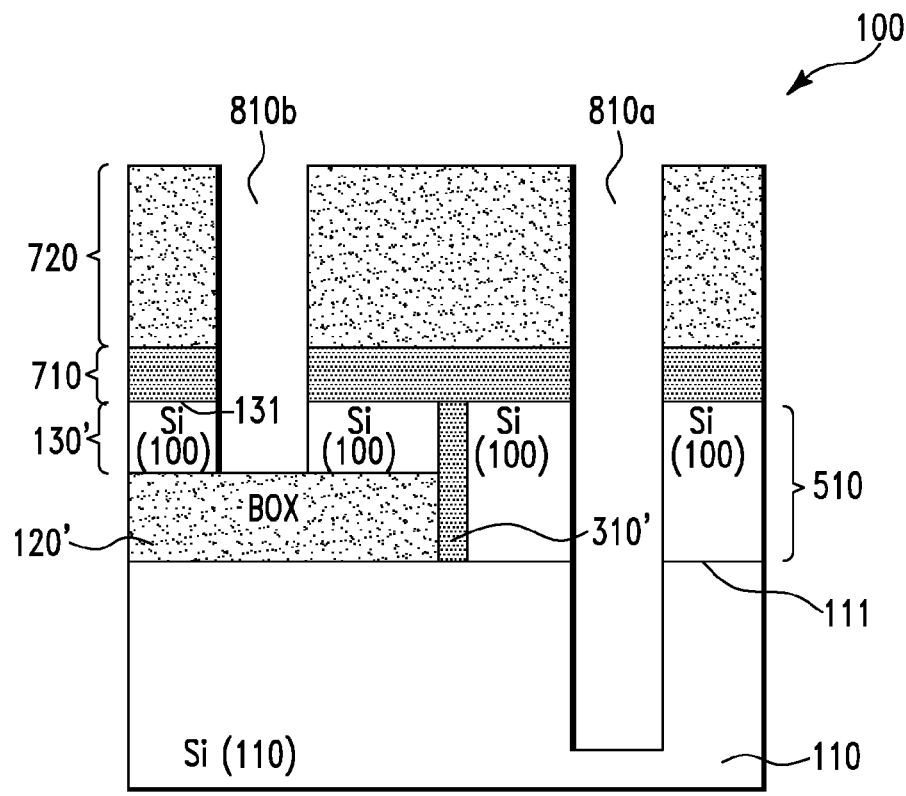

Next, with reference to FIG. 8, in one embodiment, first and second trenches 810a and 810b are simultaneously formed by photo-lithography (i.e., using a single lithographic mask) and then anisotropic etching process resulting in the semiconductor structure 100 of FIG. 7. The first trench 810a is deeper than the second trench 810b because the etching process for forming the second trench 810b is stopped by the BOX region 120'. In one embodiment, trenches 810a and 810b are formed by a RIE (reactive ion etching) process which etches silicon at a much greater rate than the hardmask layer 720 and the BOX layer 120'.

Next, in one embodiment, the hardmask layer 720 is completely removed. Illustratively, the hardmask layer 720 can be removed by wet etching.

Figure 8A:
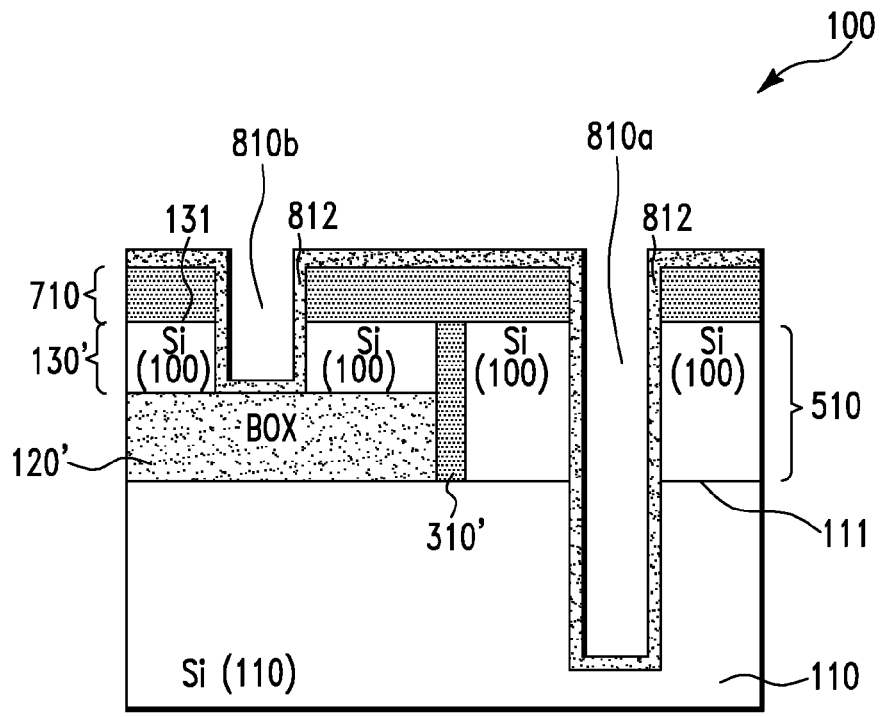

Next, with reference to FIG. 8A, in one embodiment, a dielectric layer 812 is formed on top of the structure 100 (including on the bottom and side walls of the trenches 810a and 810b). Illustratively, the dielectric layer 812 is formed by CVD or ALD (atomic layer deposition). In one embodiment, the dielectric layer 812 comprises silicon nitride, silicon oxide, silicon oxynitride, or other dielectric materials such as high-k (high dielectric) materials.

Figure 9:
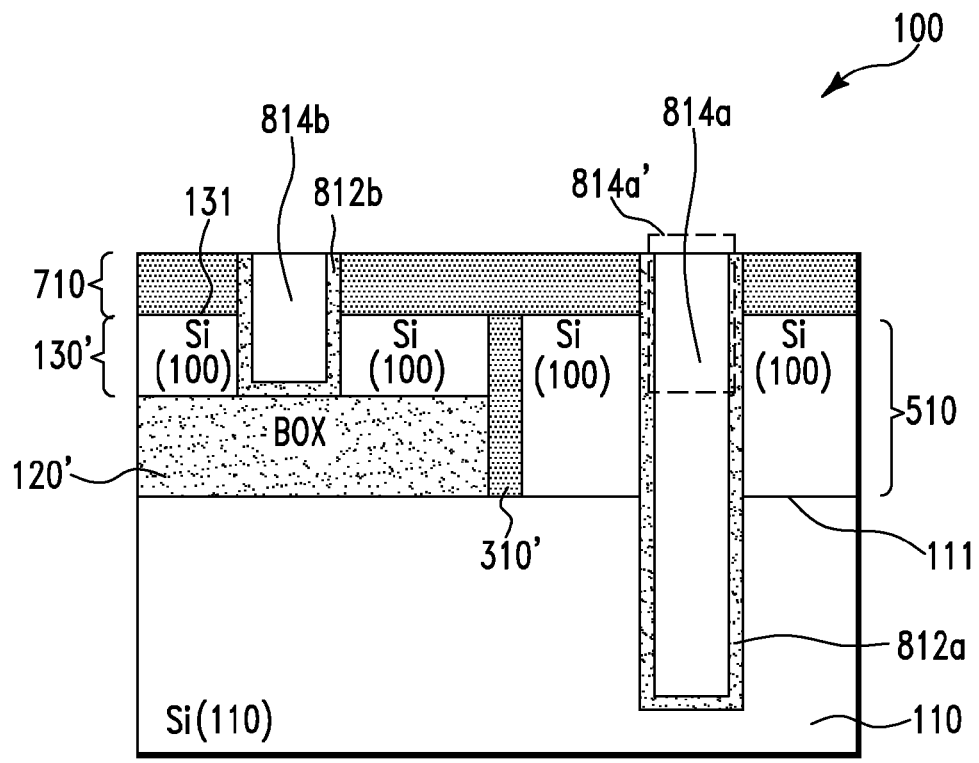

Next, in one embodiment, the first and second trenches 810a and 810b are filled resulting in the semiconductor structure 100 of FIG. 9. Illustratively, the first and second trenches 810a and 810b are filled by n-type doped polysilicon regions 814a and 814b, respectively. Alternatively, any other suitable materials such as metals (tungsten, titanium, copper, etc.) and metallic compounds (tungsten nitride, titanium nitride, tungsten silicide, cobalt silicide, etc) can be used to fill trenches 810a and 810b. In one embodiment, the first and second trenches 810a and 810b are filled by CVD or ALD and planarized by CMP. The dielectric layer 812 on top of the pad layer 710 may be consumed during CMP process. Alternatively, the dielectric layer 812 on top of the pad layer 710 can be removed by dry or wet etching process. As can be seen in FIG. 9, what remain of the dielectric layer 812 (FIG. 8A) are referred to as dielectric layers 812a and 812b.

Figure 9A:
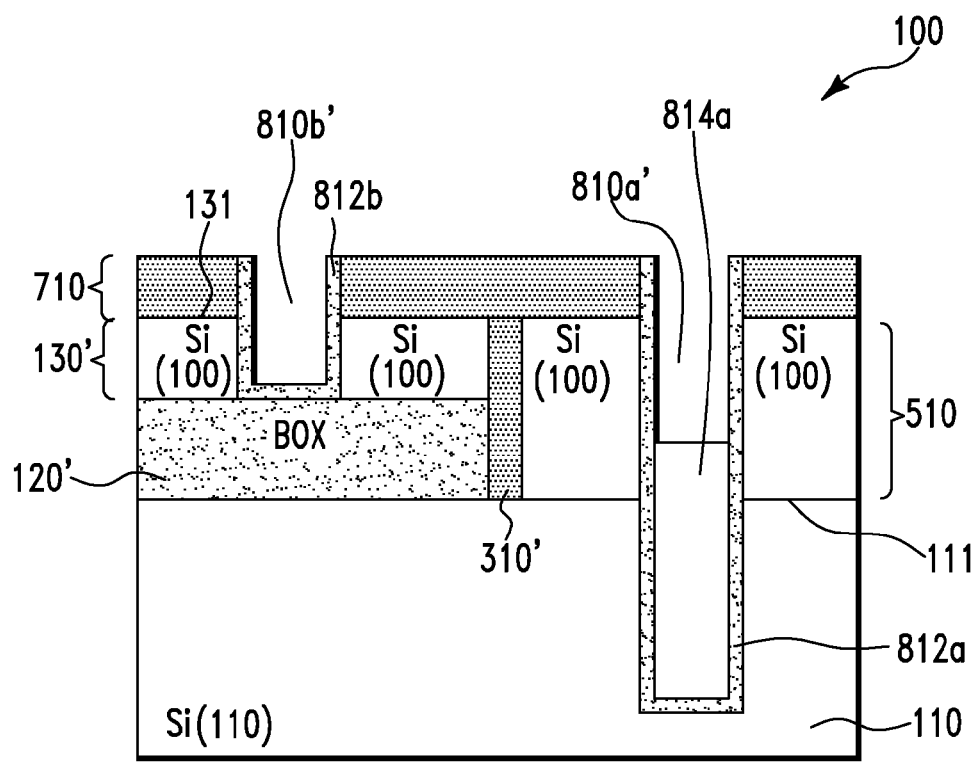

Next, in one embodiment, a top portion 814a' of the n-type doped poly silicon region 814a and the entire n-type doped poly silicon region 814b are removed resulting in the semiconductor structure 100 of FIG. 9A. Illustratively, the top portion 814a' of the n-type doped poly silicon region 814a and the entire n-type doped poly silicon region 814b are removed by anisotropic etching. In one embodiment, the anisotropic etching of the top portion 814a' of the n-type doped poly silicon region 814a and the entire n-type doped poly silicon region 814b is a RIE process.

Figure 10:
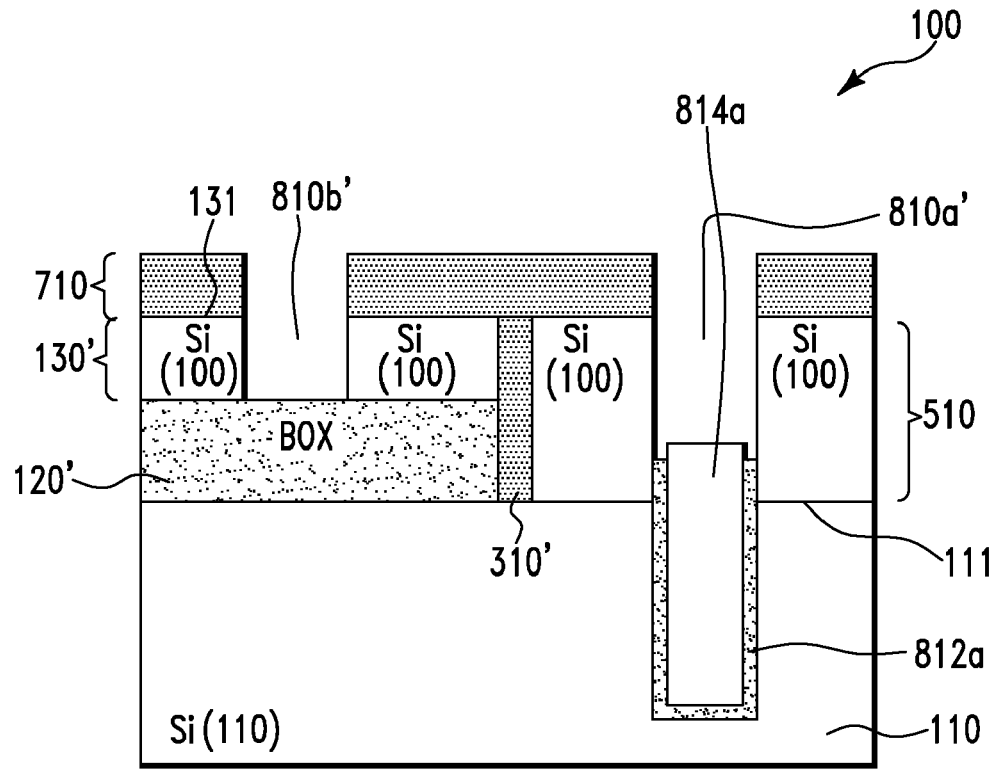

Next, with reference to FIG. 9A, in one embodiment, exposed portions of the first dielectric layer 812a and the entire second dielectric layer 812b are removed resulting in the semiconductor structure 100 of FIG. 10. Illustratively, the exposed portions of the first dielectric layer 812a and the entire second dielectric layer 812b are removed by wet etching.

It should be noted that, the removal of the top portion 814a' of the n-type doped poly silicon region 814a (FIG. 9), the entire n-type doped poly silicon region 814b (FIG. 9), the exposed portions of the first dielectric layer 812a and the entire second dielectric layer 812b results in two trenches 810a' and 810b' (FIG. 10).

Figure 11:
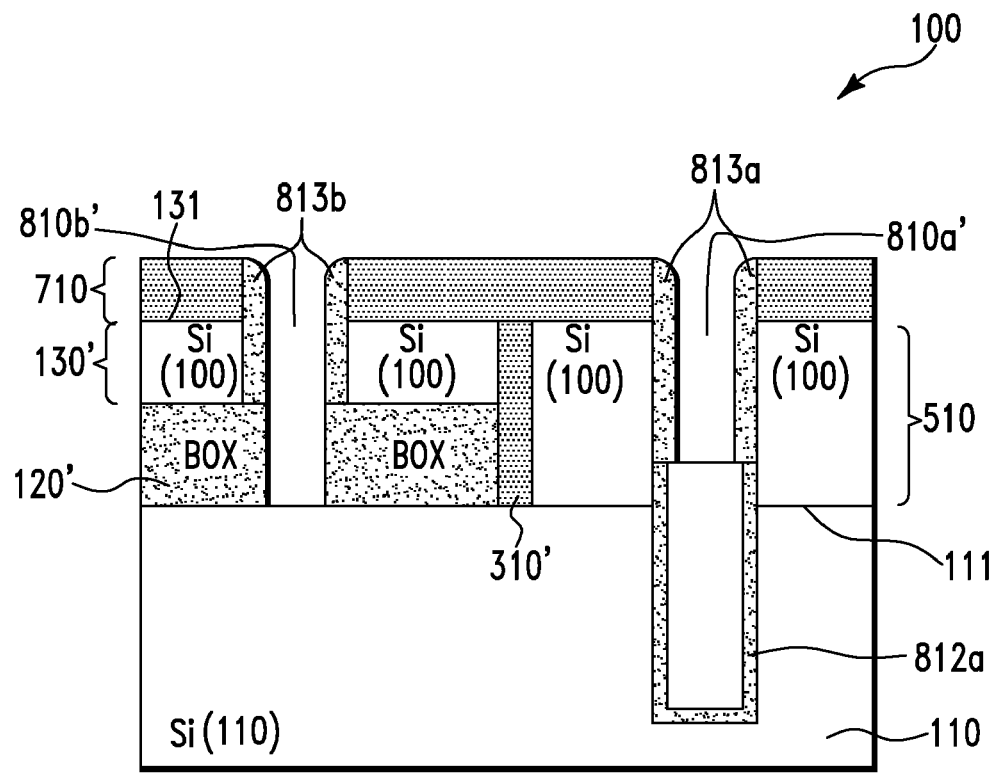

Next, with reference to FIG. 11, in one embodiment, a first collar 813a and a second collar 813b are formed on side walls of the trenches 810a' and 810b', respectively. Illustratively, the first collar 813a and the second collar 813b are formed by CVD on the semiconductor structure 100 of FIG. 10 and followed by an anisotropic etching process such as RIE. In one embodiment, the first collar 813a and the second collar 813b comprise silicon oxide. In one embodiment, the anisotropic etching step is continued to etch through the BOX region 120' until the top surface 111 of the first silicon layer 110 is exposed to the surrounding ambience via the trench 810b'.

Figure 12:
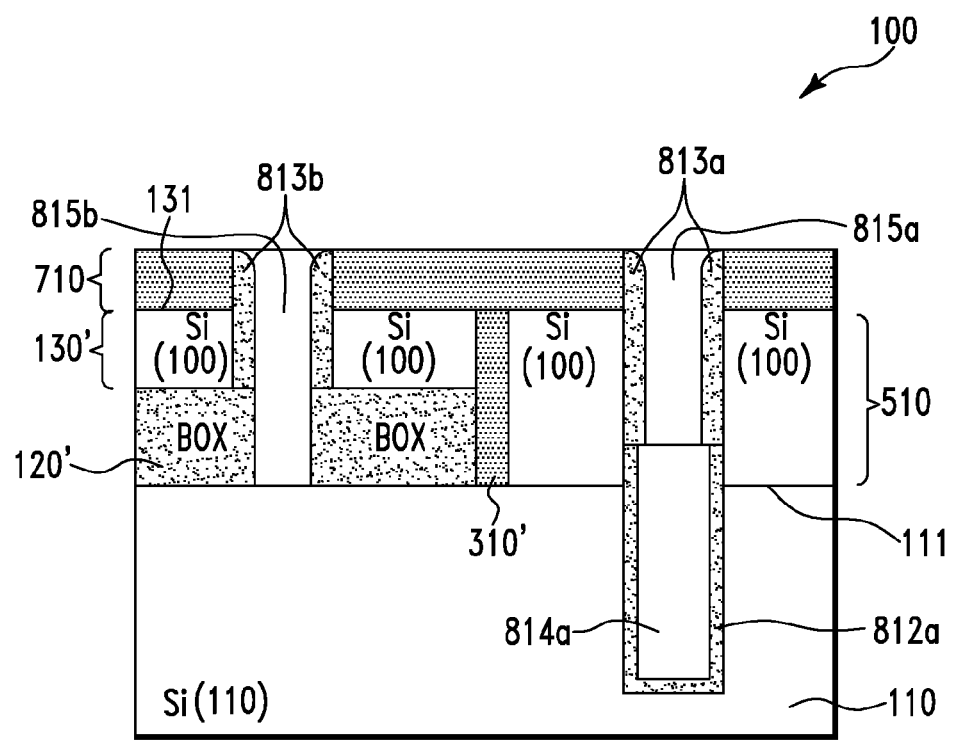

Next, in one embodiment, the trenches 810a' and 810b' are filled with a second conducting regions 815a and 815b, respectively (FIG. 12). In one embodiment, the conducting regions 815a and 815b comprise n-type doped polysilicon. Illustratively, the polysilicon regions 815a and 815b are formed in the trenches 810a' and 810b', respectively by (i) depositing polysilicon on top of the semiconductor structure 100 of FIG. 11 (including inside the trenches 810a' and 810b') by CVD, and (ii) polishing the top surface of the semiconductor structure 100 of FIG. 11 by CMP resulting in the semiconductor structure 100 of FIG. 12.

As can be seen in FIG. 12, the semiconductor structure 100 comprises a capacitor that includes a first polysilicon electrode 814a+815a, a second electrode 110, and a capacitor dielectric layer 812a. The n-type doped polysilicon region 815b provides electrical access to the capacitor electrode 110.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claim is:

1. A semiconductor fabrication method, comprising:
providing a semiconductor structure which includes: (a) a semiconductor substrate, (b) an electrically insulating region on top of the semiconductor substrate, (c) a first semiconductor region on top of and in direct physical contact with the semiconductor substrate, and (d) a second semiconductor region on top of the insulating region, wherein the first semiconductor region and the second semiconductor region are electrically insulated from each other;
forming a spacer region which is sandwiched between, and is in direct physical contact with, both the first semiconductor region and the second semiconductor region, wherein the spacer region electrically insulates the first semiconductor region from the second semiconductor region, and wherein the spacer region is direct physical contact with the semiconductor substrate;
after said forming the spacer region, forming a first trench, wherein the first trench is formed in the first semiconductor region and the semiconductor substrate; and
after said forming the spacer region, forming a second trench, wherein the second trench is formed in the second semiconductor region.

2. The method of claim 1, wherein said forming the first trench and said forming the second trench are performed simultaneously using a same lithographic mask.

3. The method of claim 1, wherein the electrically insulating region comprises silicon oxide.

4. The method of claim 1, wherein the semiconductor substrate and the first semiconductor region have a first lattice orientation, and wherein the second semiconductor region have a second lattice orientation different from the first lattice orientation.

5. The method of claim 1, wherein a bottom surface of the second trench and a top surface of the insulating region are coplanar.

6. The method of claim 1, wherein said forming the spacer region comprises:

forming a sacrificial pad layer on and in direct mechanical contact with the second semiconductor region;

forming a spacer layer on the sacrificial pad layer and on the semiconductor substrate, wherein the spacer layer is in direct mechanical contact with the sacrificial pad layer, the second semiconductor region, the insulating region, and the semiconductor substrate;

removing a first portion of the spacer layer that is in direct mechanical contact with the sacrificial pad layer and a second portion of the spacer layer that is in direct mechanical contact with the semiconductor substrate, leaving a first remaining portion of the spacer layer in direct mechanical contact with the sacrificial pad layer, the second semiconductor region, the insulating region, and the semiconductor substrate, wherein the remaining portion of the spacer layer comprises the spacer layer;

after said removing the first portion of the spacer layer and the second portion of the spacer layer, forming an epi silicon region on an exposed portion of a top surface the semiconductor substrate such that a top surface of the epi silicon region is above a top surface of the sacrificial pad layer;

after said forming the epi silicon region, removing the sacrificial pad layer, part of the first remaining portion of the spacer layer, and a top portion of the epi silicon region that includes the top surface of the epi silicon region, leaving a second remaining portion of the spacer layer and a first remaining portion of the epi silicon region, wherein a top surface of the second semiconductor region, a top surface of the second remaining portion of the spacer layer, and a top surface of the first remaining portion of the epi silicon region are coplanar, wherein the spacer region consists of the second remaining portion of the spacer layer.

7. The method of claim 6, wherein the method further comprises before said forming the first trench and the second trench:

forming a first pad layer on and in direct mechanical contact with the top surface of the second semiconductor region, the top surface of the second remaining portion of the spacer layer, and the top surface of the first remaining portion of the epi silicon region; and forming a hard mask layer on and in direct mechanical contact with the first pad layer such that the first pad layer is disposed between the hard mask layer and the second semiconductor, the second remaining portion of the spacer layer, and the first remaining portion of the epi silicon region.

8. The method of claim 7, wherein said forming the first trench and said forming the second trench comprises:

forming a first hole through the hard mask layer, the first pad layer, the first remaining portion of the epi silicon region, and a portion of the semiconductor substrate, leaving a second remaining portion of the epi silicon region, wherein the first semiconductor region consists of the second remaining portion of the epi silicon region;

forming a second hole through the hard mask layer, the first pad layer, the second semiconductor region; and removing the hard mask layer, leaving a remaining portion of the first hole that comprises the first trench and a remaining portion of the second hole that comprises the second trench, wherein a bottom surface of the second trench and a top surface of the insulating layer are coplanar.

9. A semiconductor fabrication method, comprising:

providing a semiconductor structure which includes: (a) a semiconductor substrate, (b) an electrically insulating region on top of the semiconductor substrate, (c) a first semiconductor region on top of and in direct physical contact with the semiconductor substrate, and (d) a second semiconductor region on top of the insulating region, wherein the first semiconductor region and the second semiconductor region are electrically insulated from each other;

forming a first trench, wherein the first trench is formed in the first semiconductor region and the semiconductor substrate;

forming a second trench, wherein the second trench is formed in the second semiconductor region; and after said forming the first trench and said forming the second trench are performed, using the first trench and the second trench to form a trench capacitor and an electrode contact for the capacitor, respectively.

10. The method of claim 9, wherein said using the first trench and the second trench to form a trench capacitor and an electrode contact for the capacitor comprises:

forming a first capacitor dielectric layer on side walls and a bottom wall of the first trench and forming a second capacitor dielectric layer on side wall and bottom wall of the second trench; then forming a trench electrode in the first trench and filling the second trench with a second electrically conducting region so as to form the electrode contact in the second trench; then removing (i) a top portion of the first electrically conducting region and (ii) the second electrically conducting region; then removing an exposed portion of the first capacitor dielectric layer and the entire second capacitor dielectric layer resulting in a third trench and a fourth trench, respectively; then forming a first collar on the third trench and forming a second collar on the fourth trench; then etching through the electrically insulating region until a top surface of the semiconductor substrate is exposed to a surrounding ambient via the third trench; and then filling the third trench and the fourth trench with an electrically conducting material.

11. The method of claim 10, wherein the first and second collars comprise a same material as the electrically insulating region.

12. The method of claim 10, wherein the electrically conducting material comprises doped polysilicon, and wherein the first and the second capacitor dielectric layers comprise silicon nitride.

13. The method of claim 10, wherein said forming the first collar, said forming the second collar, and said etching through the electrically insulating region are performed by a single anisotropic etching process.

* * * * *